(12) United States Patent
Ansems et al.

(10) Patent No.: US 10,989,394 B2
(45) Date of Patent: Apr. 27, 2021

(54) THIN OLED LIGHTING MODULE

(71) Applicant: OLEDWorks GmbH, Aachen (DE)

(72) Inventors: Wilhelmus Johannes Hendricus Ansems, Eindhoven (NL); Rémy Cyrille Broersma, Eindhoven (NL); Martinus Petrus (Martin) Creusen, Wijlre (NL); Jozef Willebrordus van Roosmalen, Rotterdam (NL); Martin Herman Weggen, Doetinchem (NL); Jiang Hong (Joan) Yu, Best (NL)

(73) Assignee: OLEDWorks LLC, Rochester, NY (US)

( * ) Notice: Subject to any disclaimer, the term of this patent is extended or adjusted under 35 U.S.C. 154(b) by 0 days.

(21) Appl. No.: 16/771,418

(22) PCT Filed: Jan. 9, 2019

(86) PCT No.: PCT/EP2019/050399
§ 371 (c)(1),
(2) Date: Jun. 10, 2020

(87) PCT Pub. No.: WO2019/137937
PCT Pub. Date: Jul. 18, 2019

(65) Prior Publication Data
US 2020/0348009 A1    Nov. 5, 2020

Related U.S. Application Data

(60) Provisional application No. 62/615,129, filed on Jan. 9, 2018.

(51) Int. Cl.
*F21V 19/00*    (2006.01)
*F21V 15/01*    (2006.01)
(Continued)

(52) U.S. Cl.
CPC ............ *F21V 19/003* (2013.01); *F21V 15/01* (2013.01); *H01L 51/5203* (2013.01);
(Continued)

(58) Field of Classification Search
CPC ... F21V 19/003; H01L 51/5203; Y02B 20/30; H05K 2201/05
See application file for complete search history.

(56) References Cited

U.S. PATENT DOCUMENTS 7,786,559 B2    8/2010 Bayne et al.
7,960,913 B2    6/2011 Yee et al.
(Continued)

FOREIGN PATENT DOCUMENTS

EP    2661778 B1    1/2015
JP    2007005226 A    1/2007
(Continued)

*Primary Examiner* — Zheng Song (57) ABSTRACT

An OLED lighting module comprising a support (2); an OLED lighting panel (3) with an emissive side with emissive and non-emissive areas (38) and an opposite side which comprises an OLED substrate (31), an OLED light-generating unit and a circuit board (34); an opaque liner with a first section (41) that covers at least part of the non-emitting areas (38) over the OLED substrate and a second section (42) that extend past the edges of the OLED substrate on the emissive side of the OLED panel; and an opaque bezel (6) in contact with the support (20), the opaque bezel (6) covering at least part of the second section (42) of the opaque liner but not the first section (41) of the opaque liner. By covering only that portion of an opaque liner that extends past the edges of the OLED substrate with a bezel and not the OLED substrate itself, the module can be made thin.

15 Claims, 9 Drawing Sheets

(51) Int. Cl.
*H01L 51/52* (2006.01)
*F21Y 115/15* (2016.01)
(52) U.S. Cl.
CPC ... *F21Y 2115/15* (2016.08); *H01L 2251/5338* (2013.01); *H01L 2251/5361* (2013.01)

(56) References Cited

U.S. PATENT DOCUMENTS

| | | |
|---|---|---|
| 7,961,456 B2 | 6/2011 | Ha et al. |
| 8,430,530 B2 * | 4/2013 | Aurongzeb ............... F21S 8/06 |
| | | 362/249.04 |
| 8,471,462 B2 | 6/2013 | Moon |
| 8,885,116 B2 | 11/2014 | Bayne et al. |
| 9,723,686 B2 | 8/2017 | Ito et al. |
| 9,727,080 B2 | 8/2017 | Jung et al. |
| 2009/0207560 A1 | 8/2009 | Lee |
| 2010/0327737 A1 | 12/2010 | Hayashi et al. |
| 2014/0247584 A1 | 9/2014 | Kodama et al. |
| 2014/0293573 A1 * | 10/2014 | Kang ................ G02F 1/133308 |
| | | 362/19 |
| 2014/0334146 A1 * | 11/2014 | Hack ..................... H01L 25/048 |
| | | 362/235 |
| 2015/0308129 A1 * | 10/2015 | Peck ...................... F21V 15/01 |
| | | 362/217.11 |
| 2016/0061422 A1 | 3/2016 | Evenson et al. |
| 2016/0320027 A1 | 11/2016 | Ito et al. |
| 2017/0254518 A1 * | 9/2017 | Vasylyev ............. F21V 17/007 |
| 2018/0006249 A1 | 1/2018 | Riedel et al. |
| 2018/0373370 A1 * | 12/2018 | Jung ................... H04M 1/0266 |

FOREIGN PATENT DOCUMENTS

| | | |
|---|---|---|
| JP | 2016225209 A | 12/2016 |
| KR | 20090093058 | 9/2009 |
| WO | 2017147373 A1 | 8/2017 |
| WO | 2018037113 A1 | 3/2018 |

* cited by examiner

THIN OLED LIGHTING MODULE

CROSS REFERENCE TO RELATED APPLICATIONS

This application claims the benefit of U.S. Provisional Application No. 62/615,129, filed Jan. 9, 2018. Reference is also made to co-filed and commonly assigned PCT International Application number PCT/EP2019/050407, entitled 'ULTRATHIN OLED LIGHTING PANEL'.

BACKGROUND

OLED technology offers many advantages for general lighting purposes. OLED devices are efficient in terms of light output for power consumed. They are low voltage which helps avoid potential electrical shocks, less prone to sparking in potentially explosive environments, and they reduce loads in the supporting electrical system. The spectrum of emitted light can be varied using appropriate internal designs. They produce little or no UV or IR light. They are instant on; that is, they emit light immediately whenever electrical power is supplied. OLED light sources are inherently flat area light sources. They offer several advantages over LED light sources. OLED devices can be made even thinner (for example, less than 1 mm thick) and they produce less heat under normal operating conditions. However, OLED lifetimes can be an issue. Both LED and OLED devices can be made on flexible or curved supports although OLED is preferred for these types of applications.

Generally speaking, an OLED device used for lighting purposes would include an OLED lighting panel as the light source. An OLED panel would have at least three parts: a substrate, an OLED light-emitting unit upon the substrate, and electrical connections which provide power to the internal OLED electrodes from an external source. An OLED light-emitting unit would have at least one organic electroluminescent layer between two electrodes and would be encapsulated to protect the electroluminescent layer(s) from air and/or water. Typically, the OLED panel would have emissive areas surrounded by non-emitting borders. Electrode contact pads, which are connected to the internal electrodes, are often located in these non-emitting border areas on the same face of the substrate as the electroluminescent layers or on the non-emitting areas on the backside. OLED light-emitting units can be prepared on either rigid or flexible substrates. While both can be very thin, flexible substrates are advantaged since they can be used in curved or bent designs as well as in rigid (flat or bent) applications when further supported by an inflexible or rigid housing or mounting.

OLED lighting panels can be used as a light source in a luminaire or lamp. Luminaires are used in many ways; for example, overhead lighting such as chandeliers, wall lighting such as sconces or table lighting such as desk lamps. In order to minimize production costs, it would be desirable to incorporate the OLED lighting panel in a single modular design that can be used in many different styles of luminaires. An OLED lighting module would be a set of standardized parts or independent units that can be used to construct a more complex structure using an OLED lighting panel as the light source.

Generally speaking, an OLED module would have at least three parts: a bottom housing or support, an OLED lighting panel in the middle and a top housing or bezel with an opening for light emission. The bottom housing may also have an opening for light emission as well if using an OLED panel that emits light from two sides or if two OLED light panels are used back-to-back. To maintain a slick and neat appearance, the external electrical connections are usually hidden within the module and external electrical connections are through a standardized non-permanent connection point such as an electrical jack or plug. This is consistent with a modular design. The lighting module should also have some allowance for mechanical support and/or attachment to the body of the luminaire.

It would be desirable to design a module using an OLED lighting panel where the module takes full advantage of the thinness and flexibility of the OLED lighting panel. Thus, the module could be flexible. However, since in some applications a flexible module is not desirable, the module could be rigid and flat and still emphasize the thinness of the OLED panel. In other applications, the lighting module could be rigid and curved in order to emphasize the flexibility of the OLED lighting panel as well. Such designs would have aesthetic appeal in many applications.

The use of rigid curved lighting modules in a luminaire is known, including the use of flexible OLED lighting panels mounted on a rigid and curved support. For example, U.S. Pat. No. 9,723,686, US2016/0320027, US20160061422 and JP2016225209 all describe flexible OLED lighting panels mounted on a rigid and curved support. JP2007-005226 describes a flat lighting module with a clam-shell like housing for supporting an OLED lighting panel. The housing has a frame that covers the non-emitting portions of the OLED lighting panel. However, there are problems and issues that need to be addressed in maintaining a thin appearance of a module.

In a luminaire with a modular design, an OLED panel needs to be permanently mounted on the housing or support within the module. Since the OLED panels create some degree of heat, they must be mounted in a way that prevents thermal buckling. For example, attaching the OLED panel only on both ends (without any attachment in the middle of the panel) would be desirable for ease of mounting, but could allow for buckling during extended operation. Moreover, any end-only attachment means would have to be fairly thick in order to provide the degree of robustness required so that the panel doesn't become loose.

Another way to attach an OLED lighting panel to a housing is to use a bezel that covers the ends and sides of the OLED lighting panel. A bezel is generally a grooved ring or partial cover that holds the lighting panel in position. It would fit over the surface of the panel and be attached to either the lighting panel or support or both. The use of such bezels is known; for example, see U.S. Pat. Nos. 7,961,456, 7,960,913, 8,885,116, 7,786,559, 8,471,462, and EP2661778. However, since these bezels are designed in part to provide shock protection to the panels, they are robust and do not allow for a module that is as thin as possible.

While the support and/or bezel can act to some degree as a heat sink, they may not provide enough thermal protection to prevent thermal buckling or degradation of the OLED panel. This problem can be solved by adding an additional heat sink structure, but this will only add additional thickness to the module.

Electrical power needs to be delivered to the OLED panel within the module. OLED lighting panels typically have electrical contact pads along the non-emitting sides of the emissive area of the panel on the same side of the OLED substrate or on its backside. For some applications, it would be desirable for aesthetic reasons to have the electrical connections made in the center of the backside of the module (if curved, ideally at the midpoint of the curvature). In such modules using only a single OLED lighting panel or an odd number of panels, it can be difficult to maintain the thinness of the module(s) since the electrical connections from at least one of the OLED panels within the module must run from the external contact pads of the OLED light-emitting unit to the middle of the backside of the module. For such modules using two OLED panels or an even number of panels, the electrical connections can be made along one of the edges of the panels, although the electrical connection still needs to run through the module to the backside.

There is a desire for a lighting module for use in a luminaire or other general lighting fixtures where the lighting module uses an OLED lighting panel while maintaining as thin a profile as possible. In addition, it would be desirable that in order to maximize the amount of emitted light from the module, the front housing/bezel should not cover any of the emitting portions of the OLED lighting panel. While the bezel could cover all of the non-emitting portions of the OLED lighting panel, having the bezel cover the panel directly could add thickness to the overall module and leads to a situation where the surface of the OLED lighting panel is significantly below the top surface of the bezel, giving a noticeable indented or set-back appearance that may not be desirable. Moreover, having the bezel cover all of the non-emitting portions of the OLED panel might lead to impression of having a relative wide frame which would distract from a thin and slick appearance.

SUMMARY

A very thin OLED lighting module is enabled by attaching an OLED lighting panel to a support using a bezel located over a portion of an opaque liner on the emitting side of the OLED lighting panel that overlaps the edges of the OLED substrate. By covering only those portions of an opaque liner that extend past the edges of the OLED substrate and not the OLED substrate itself, the bezel can be made much thinner and yet still affix the panel to the module support.

This can be accomplished by an OLED lighting module comprising: a support; one or more OLED lighting panel(s) on the support, wherein each OLED panel has an emissive side with emissive and non-emissive areas and an opposite side, and comprises an OLED substrate, an encapsulated OLED light-generating unit on the OLED substrate and a circuit board containing flat electrical connectors, the circuit board being located between the OLED light-generating unit and the support; an opaque liner on the emissive side of the OLED panel, the opaque liner having two sections: a first section that covers at least part of the non-emitting areas over the OLED substrate and a second section that extends past the edges of the OLED substrate; and an opaque bezel in contact with the support, the opaque bezel covering at least part of the second section of the opaque liner but not the first section of the opaque liner.

In some embodiments, the support (metal or plastic) is rigid and curved and the opaque bezel can either be rigid and curved or flexible. The bezel lies along and hides the thin vertical edges of the OLED panel. The OLED lighting panel and its components can be flexible. The OLED panel can be bottom-emitting. The opposite side of the OLED panel can be non-emitting or emitting with emissive and non-emissive areas.

There can be a transmissive covering, which can be flexible, over the emissive areas of the OLED panel. In some embodiments, the transmissive covering is a light-management film with portions that extend past the edges of the OLED substrate; wherein the light-management film is covered in part by the first section of the opaque liner, and where the extended portions of the light-management film are covered at least in part by the second section of the opaque liner and at least in part by the bezel. In some embodiments, the outside edges of the opaque liner correspond to or exceed the outside edges of the transmissive covering. In other embodiments, the outside edges of the opaque liner are entirely within the outside edges of the transmissive covering.

In some embodiments, a portion of the circuit board extends past the edges of the OLED substrate.

In some embodiments, there is a backing plate located between the circuit board and the support. In some cases, a portion of the backing plate extends past the edges of the OLED substrate.

In addition to the opaque liner, the bezel may additionally cover the extending portions of the transmissive covering, the circuit board and backing plate individually or in any combination. In one preferred embodiment, the bezel covers the extending portions of the opaque liner and backing plate. In another preferred embodiment, the bezel covers the extending portions of the opaque liner, the transmissive covering, the circuit board and backing plate.

The flat electrical connectors of the circuit board are in electrical contact with the internal electrodes of the OLED. The flat connectors are located on the surface of the circuit board facing the OLED. The flat electrical connectors on the circuit board of the OLED panel connect to electrical contact pads for the panel, which are located in non-emitting areas on either the front or back of the panel.

OLED lighting modules can be prepared that are very thin but yet are robust. This allows for a stylish and sophisticated appearance different from other types of lighting panels (i.e. LED) or from known lighting modules. The lighting modules can be used in flexible, rigid and flat, or rigid and curved applications. If the opaque liner is made of a flexible material, it can absorb some of the external forces put on the OLED panel. Moreover, using a flexible opaque liner minimizes problems due to differences in thermal expansion between the materials of the lighting module. Luminaires using OLED lighting modules can be manufactured with reduced cost and complexity.

BRIEF DESCRIPTION OF THE DRAWINGS

The Figures are not drawn to scale.

DETAILED DESCRIPTION

In the following, the example module and panel structures are all shown as being rectangular in shape and length and so, references are made to length and width. However, the modules and panels are not limited to any particular shape and so, may be square, circular, oval, triangular or an irregular shape. In any case, the module, panel and certain internal features will all have outside edges and so, for shapes other than square or rectangular, corresponding dimensions (for example, radius for circular panels) should be applied. Rectangular or square panels are preferred. In addition, although the examples refer to using an OLED as a specific example of a light-emitting unit, any kind of light-emitting unit containing organic material would be generally useful. By one structure "covering" or "covers" another structure, it is meant that one lies over (relative to the bottom) either entirely or partially.

An OLED module of the invention comprises at a minimum, a support, an OLED lighting panel, and a bezel. The OLED lighting panel used in the OLED module comprises at a minimum, an OLED substrate, an encapsulated OLED light-generating unit on the OLED substrate and a circuit board. The OLED panel is retained to the support by a bezel which covers at least an overlapping or free-hanging portion of an opaque liner which also covers a non-emissive (also called non-emitting) portion of the OLED panel.

It is desirable that the overall thickness of the OLED module should be no more than 5 mm, preferably less than 3 mm and most desirably less than 2 mm.

Figure 1A:
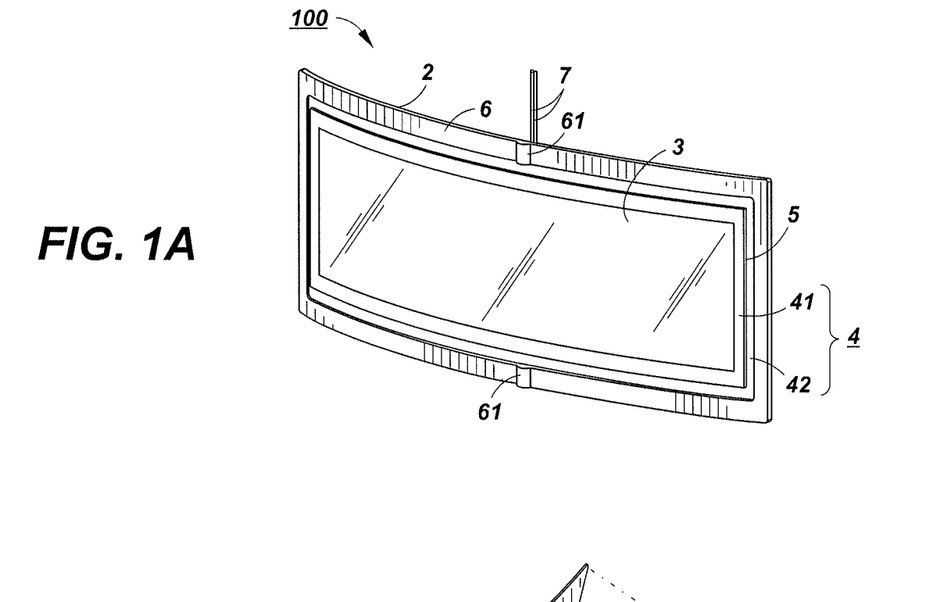
FIG. 1A is a top view of one side of a curved OLED module.

FIG. 1A is a view of the emissive side of one embodiment of the OLED module 100 of the invention. In this embodiment, there is a rigid and curved support 2 on which there is a flexible OLED lighting panel 3 which conforms to the shape of the support. The curve of the support 2 forms a regular arc where the emissive surface of the OLED lighting panel 3 is on the outside side of the arc. Surrounding the emissive area of the OLED lighting panel 3 and covering the non-emissive area is an opaque liner 4, which has two connected sections. A first portion 41 of the opaque liner 4 lies over at least part of the non-emitting border of the OLED panel which is supported by the OLED substrate. There is a second portion 42 of the opaque liner that extends past the outside edges of the OLED substrate. These two different portions or sections of the opaque liner 4 cover areas with different heights and so, there will be a visible change in height between sections 41 and 42 in the opaque liner 4 as indicated by 5. The outside edges of the opaque liner 4 (specifically the second portion 42 of the opaque liner that extends past the OLED substrate) are covered by a bezel 6, which runs along the top edge of the module as well as along its side edges. The bezel does not cover any of the first portion of 41 of the opaque liner. There is a thickening 61 of the bezel in one area. This thickening can be part of or cover a point of attachment of the module. This view also shows external wires 7 that originate from the opposite side of the module 100.

Figure 1B:
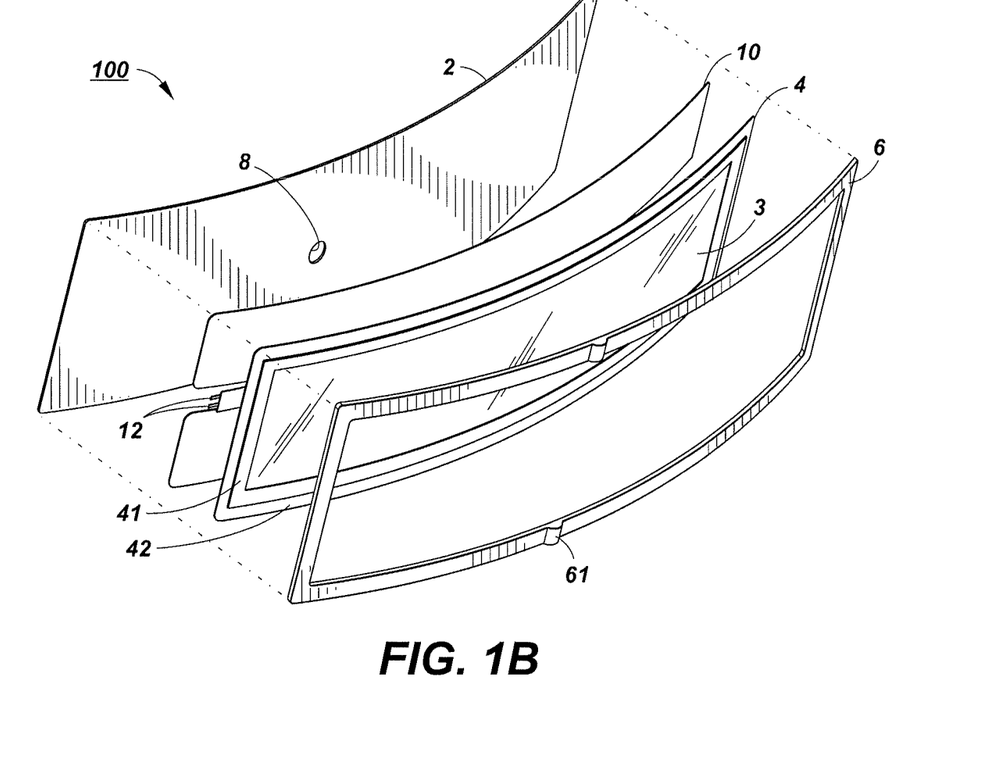
FIG. 1B is an exploded view of the same OLED module in the same direction.

FIG. 1B is an exploded view of OLED module 100 as shown in FIG. 1A. There is a backing plate 10 between the non-emissive side of the OLED panel 3 and the rigid and curved support 2. On the non-emitting side of the OLED panel 3, the ends of the internal wire connectors 12 can be seen. In this embodiment, an opening or wiring port 8 is located in the center (the midpoint of the length and width) of the module on its back.

Figure 1C:
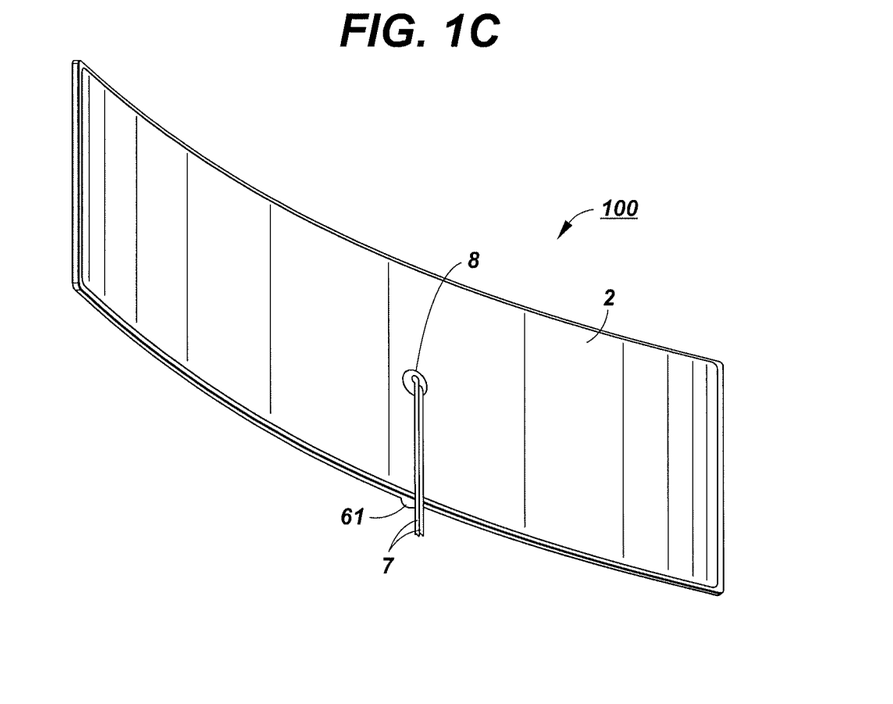
FIG. 1C is a top view of the other side of the same OLED module as in FIGS. 1A and 1B.

FIG. 1C is a view of the non-emissive side of the OLED module 100. This view is of the inside curve of the arc. Shown is the rigid and curved support 2 with external wires 7 extending from the opening 8. The external wires 7 supply power from an external source via the flat electrical connectors 12 to the contact pads 14 of the OLED lighting panel within the module.

Figure 1D:
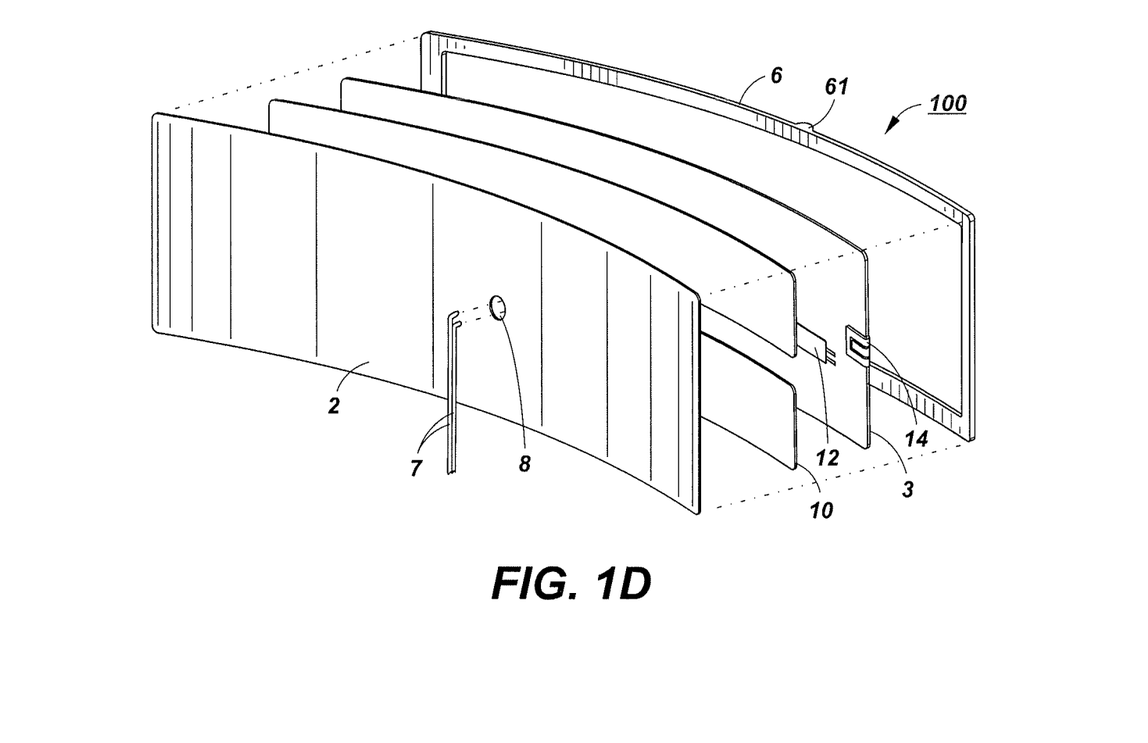
FIG. 1D is an exploded view of the same OLED module in the same direction as FIG. 1C.

FIG. 1D is an exploded view of OLED module 100 as shown in FIG. 1C. In this view, panel contact pads 14, located on the back (non-emitting side) of OLED panel 3, can be seen. In the assembled module, the panel contact pads 14 are electrically connected to the wire connectors 12. The wire connectors 12 run from the contact pads 14 to the external wires 7 at the opening 8 and run between the circuit board, which in this embodiment is on the non-emissive side of OLED panel 3, and the front of the support between cut-outs in the backing plate 10.

Figure 2:
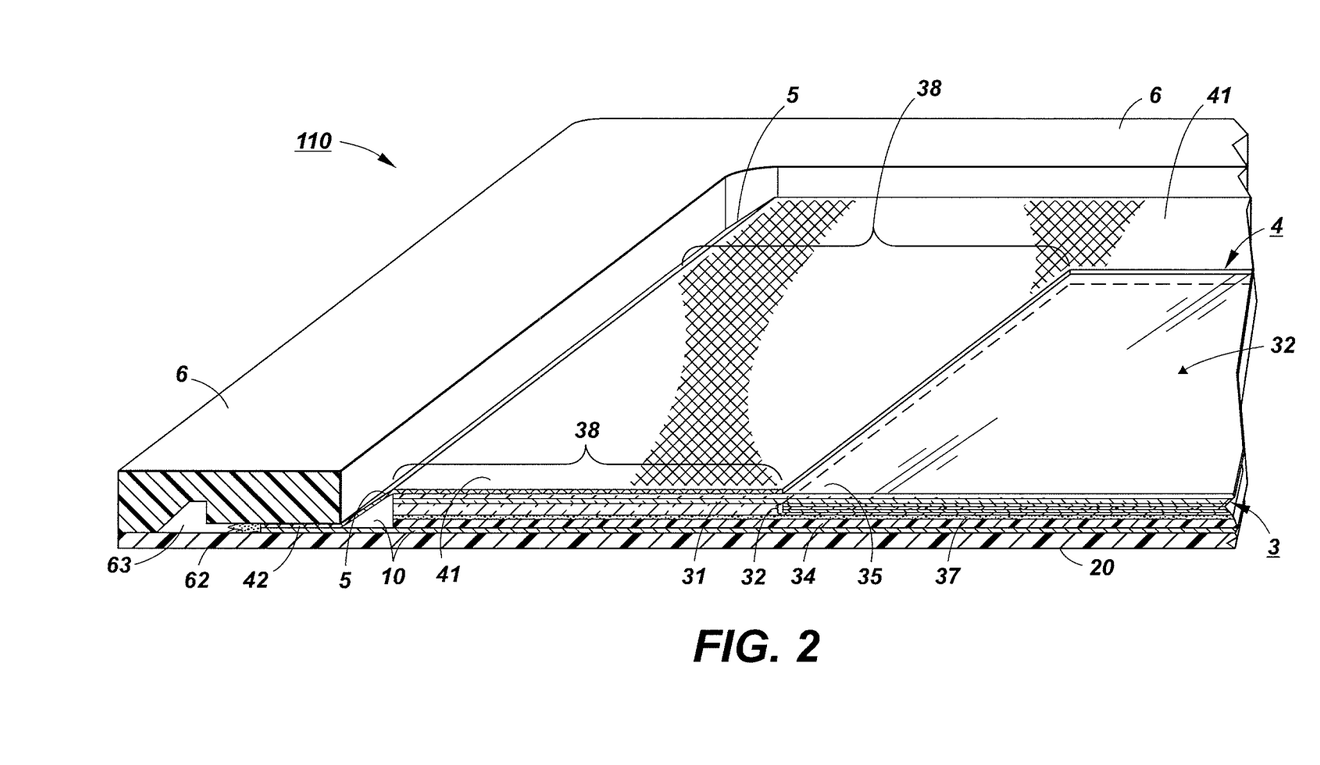
FIG. 2 is a cross-sectional view of a flat OLED module showing the details of the bezel, the OLED lighting panel and module support.

FIG. 2 is a cross-sectional view of another inventive OLED module 110 using the flexible OLED panel 3 as the light source. The only difference between OLED module 100 as shown in FIGS. 1A-1D and OLED module 110 is that in this embodiment, the support 20 is rigid and flat as opposed to rigid and curved. Otherwise, all parts are the same. On the rigid and flat support 20 is the backing plate 10. Over the backing plate is located OLED panel 3 which has an OLED substrate 31 with an emissive area 32 surrounded by a non-emissive area 38. Note that the backing plate 10 extends past the end of the OLED substrate 31 of OLED panel 3 and is covered by the bezel 6. Over the non-emissive area 38 of the OLED panel 3 is the first section (portion) 41 of the opaque liner. Note that opaque liner 4 is arranged so that section 41, which is over the OLED substrate 31, does not significantly cover the emissive area 32 and extends over the non-emissive area 38 of the OLED panel 3 and which also is over the OLED substrate 31. A second section 42 of the opaque liner 4 extends past the edge of the OLED substrate 31 to come in contact with the backing plate 10 and is covered by the bezel 6. Note that portion 42 of the opaque liner is not over the OLED substrate 31. There is a relative change in the overall thickness of the package past of the edge of the OLED substrate 31 where the opaque liner 42 meets the backing plate 10. This is indicated by 5. Note that in this embodiment, the bezel 6 covers only the second portion 42 of opaque liner 4 and the backing plate 10. The OLED substrate 31 is not located under the bezel 6. In this embodiment, the bezel 6 is bonded to the flat and rigid support 20 with an adhesive at adhesive area 62. There is also an adhesive overflow area 63 within the bezel 6. Circuit board 34, covering 35, and optional adhesive layer 37 will be discussed in further figures.

Figure 3A:
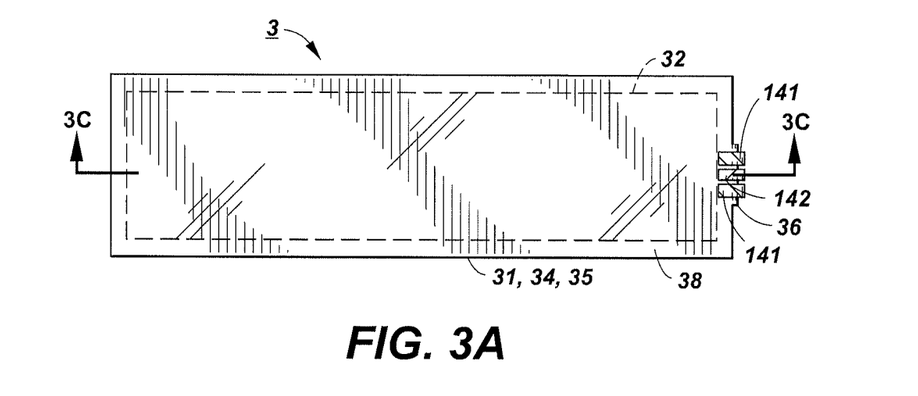
FIG. 3A is a top view of the emissive side of an OLED lighting panel.

FIG. 3A is a top view of the emissive side of one embodiment for a flexible bottom emitting (light is emitted through a transparent substrate) OLED lighting panel 3 useful for the OLED lighting module. On the surface of the emissive side, there is an (optional) transmissive covering 35 through which light from the OLED light-generating unit is transmitted. Beneath the covering 35 is the OLED substrate 31, which is transparent. On the side of the OLED substrate 31 opposite from the covering 35 is the OLED light-emitting unit, which has an emissive area 32 surrounded by a non-emissive area 38. On the non-emitting side of the OLED light-emitting unit, there is a circuit board 34.

In this example, the transmissive covering 35, OLED substrate 31, the light-generating OLED unit 32/38 and circuit board 34 all have approximately the same length and width dimensions. Circuit board 34 has two flat electrical connectors 141 and 142 (which together form a contact pad 14 for the OLED panel) that are separately connected to the two internal electrodes within the OLED light-generating unit and extend out from the emissive area 32 on an extension tab 36. The flat electrical connectors 141 and 142 of the circuit board 34 are located on the side of the circuit board 34 facing the non-emitting side of the OLED light-generating unit. In other embodiments, the flat electrical connectors 141 and 142 on the extension tab 36 may be covered by an insulating material and not visible from the emissive side.

Figure 3B:
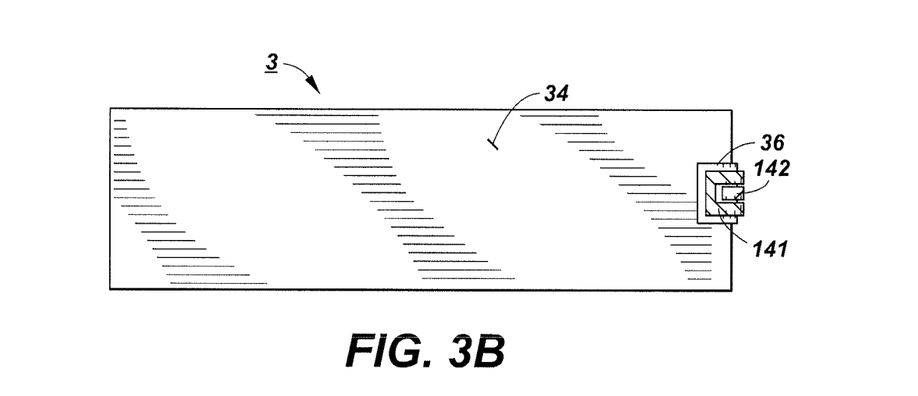
FIG. 3B is a top view of the non-emissive side.

FIG. 3B is a top view of the non-emissive side of the same OLED lighting panel 3 shown in FIG. 3A. On the backside of the circuit board 34 is located the OLED panel contact pad 14 consisting of flat electrical connectors 141 and 142 on the extension tab 36 which is folded back so that the backside (the side opposite the flat electrical connectors) of the extension tab 36 is in contact with the backside of the circuit board 34.

Figure 3C:
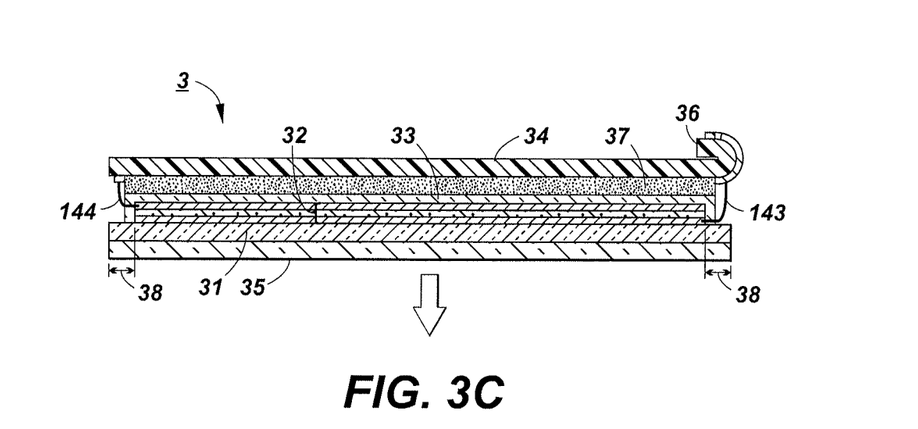
FIG. 3C is a cross-section view of the same OLED lighting panel.

FIG. 3C is a cross-sectional view of OLED lighting panel 3. On the surface from which light is emitted (as indicated by the arrow), there is a transmissive covering 35. Above this, there is the OLED substrate 31. Above the OLED substrate is the OLED light-emitting unit emissive area 32 (comprising a first electrode, intermediate organic layer(s) for light emission and a second electrode). The emitting portion 32 of the OLED light-emitting unit does not extend to the edge of the OLED substrate 31, thus creating surrounding non-emissive area 38. Above the OLED light-emitting unit emissive area is encapsulation 33. Above that, there is an optional adhesive layer 37 whose purpose, whenever present, is to affix the OLED light-emitting unit 32 and OLED substrate 31 to the overlying circuit board 34. There are electrical leads 143 and 144 that extend from the electrodes within the OLED light-emitting unit 32/38 through the encapsulation 33 to make contact with the flat connectors 141 and 142 of the circuit board 34. Flat electrical connectors 141 and 142 (which together form a contact pad 14 for the OLED panel) extend along the bottom side (i.e. the side facing the OLED light-emitting unit 32) of the circuit board 34 on extension tab 36 which is folded back upon itself. This creates OLED panel contact pad 14 on the backside (non-emitting) of the OLED panel 3. In this embodiment, the area of the transmissive covering 35, the OLED substrate 31 and circuit board 34 are all the same and their outside edges correspond to each other (except for the extension tab 36 of the circuit board 34).

Figure 4:
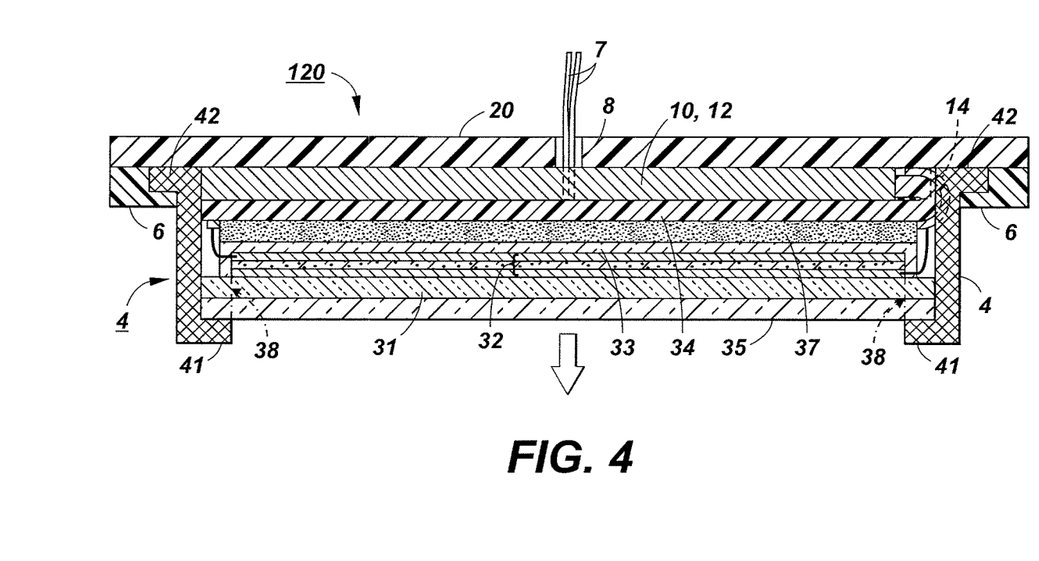
FIG. 4 is a cross-sectional view of an OLED lighting module using the OLED lighting panel shown in FIGS. 3A-3C.

FIG. 4 is a cross-sectional view of an OLED module 120, similar to module 110 as shown in FIG. 2, using the OLED lighting panel 3, as shown in FIGS. 3A-3D. There is a backing plate 10 located between the backside of the circuit board 34 and the support 20. In this embodiment, it has approximately the same area as the transmissive covering 35, the OLED substrate 31 and circuit board 34 (excluding the extension tab 36) except for any cut-outs. The outside edge of 10 generally corresponds to the others except where it is cut out to allow space for folded-over extension tab 36 on the back of the circuit board 34. Flat electrical connectors 12 run (within channels or cut-outs in backing plate 10; not visible in this view) from the panel contact pad 14 to the external wires 7 located in the center of the module. There is a first portion 41 of the opaque liner 4 over the non-emitting portions 38 of the OLED panel 3 on top of transmissive covering 35, and a second portion 42 of the opaque liner 4 has that extends past the outside edges of the OLED substrate 31. In this embodiment, the extending portion 42 of the opaque liner 4 meets the support 20. The bezel 6 is located over the opaque liner section 42 and directly contacts the support 20. Thus, in this embodiment, the OLED panel 3 is affixed to the support only by the extending portion of the second portion 42 of the opaque liner 4 that lies beneath the bezel 6. Note that the bezel does not cover any part of the OLED substrate 31.

Figure 5:
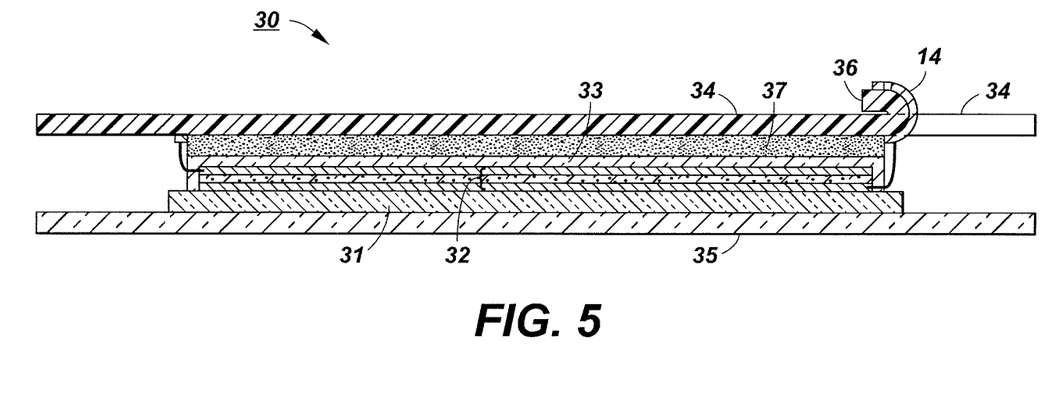
FIG. 5 is a cross-sectional view of another embodiment of an OLED lighting panel.

FIG. 5 is a cross-sectional view of another embodiment of an OLED lighting panel 30 suitable for use in the OLED module of the invention. OLED lighting panel 30 is different from OLED lighting panel 3 is that both the transmissive covering 35 and circuit board 34 are longer in both length and width dimensions than the OLED substrate 31. The circuit board 34 has a cut-out for the extension tab 36 and contact pads 14 so that they remain in the same relative position to the emitting portion of the OLED. This creates overhanging portions of 35 below the OLED substrate 31 as well as overhanging portions of 34 above the OLED substrate 31. FIG. 5 shows these overhanging portions of 34 and 35 as extending in the same plane as the portions directly in contact with the OLED substrate 31 (for 35) or adhesive layer 37/encapsulation 33 (for 34). If desired, the space between the overhanging portions may be filled with adhesive or other materials to protect the vertical edge of OLED substrate 31.

Figure 6:
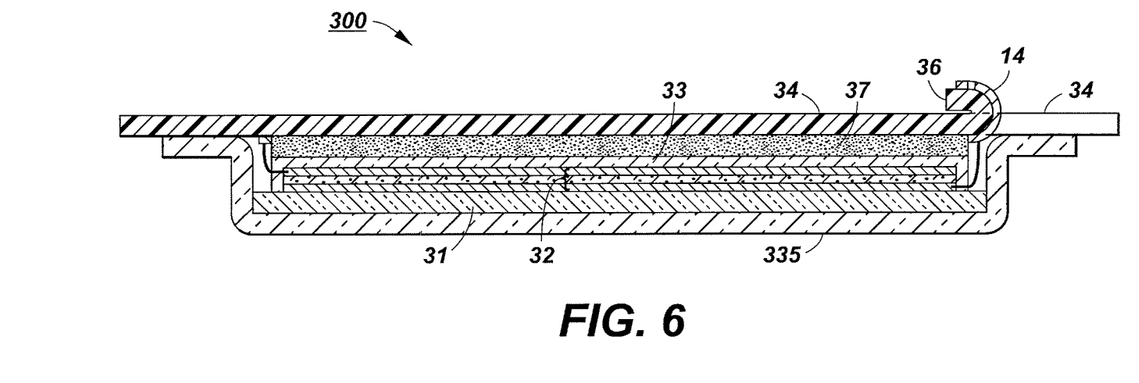
FIG. 6 is a cross-sectional view of a variation of the embodiment of the OLED lighting panel shown in FIG. 5.

FIG. 6 shows a cross-sectional view of an OLED lighting panel 300 which is another embodiment similar to 30 but where the transmissive covering 335 is sufficiently flexible that the overhanging portions comes into contact with circuit board 34 in the non-emitting areas of the OLED panel. If desired, any remaining space between the overhanging portions may be filled with adhesive or other materials to protect the vertical edge of OLED substrate 31. In this illustration, the circuit board 34 is shown as extending in the same plane as the portions directly in contact with the OLED substrate 31 while the extension of covering 335 is shown as bending to meet the circuit board 34. However, it is also possible that the covering 335 extends in the same plane while the circuit board 34 bends or the covering 335 and the circuit board 34 both bend to meet each other.

Figure 7:
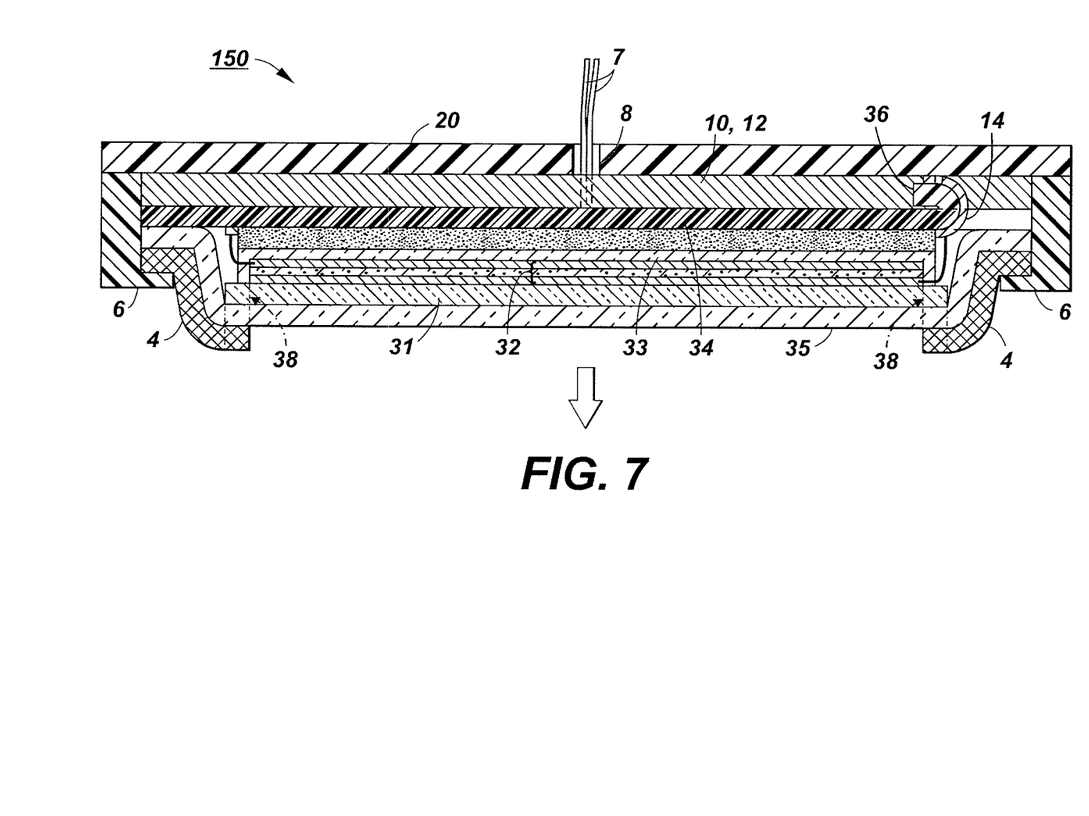
FIG. 7 is a cross-sectional view of an OLED lighting module using the OLED panel shown in FIG. 6.

FIG. 7 is a cross-sectional view of an OLED module 150, similar to that shown in FIGS. 2 and 4, using the OLED lighting panel 300, as shown in FIG. 6. There is a backing plate 10 located between the backside of the circuit board 34 and the support 20. There is a portion of backing plate 10 that extends past the OLED substrate 31 so that the outside edges correspond to the outside edges of the circuit board 34 and transmissive cover 35. Flat electrical connectors 12 run from the panel contact pads 14 to the external wires 7 located in the center of the module. Note that in this embodiment, the bezel 6 is located over portions of the opaque liner 4, the covering 35, the circuit board 34 and the cover plate 10, all within the non-emitting area 38 of the OLED lighting panel 300. All four of these structures extend past the edge of the OLED substrate 31. Only these extending portions are located under the bezel 6. The bezel does not cover any part of the OLED substrate 31. The bezel is in direct contact with the support 20.

Figure 8:
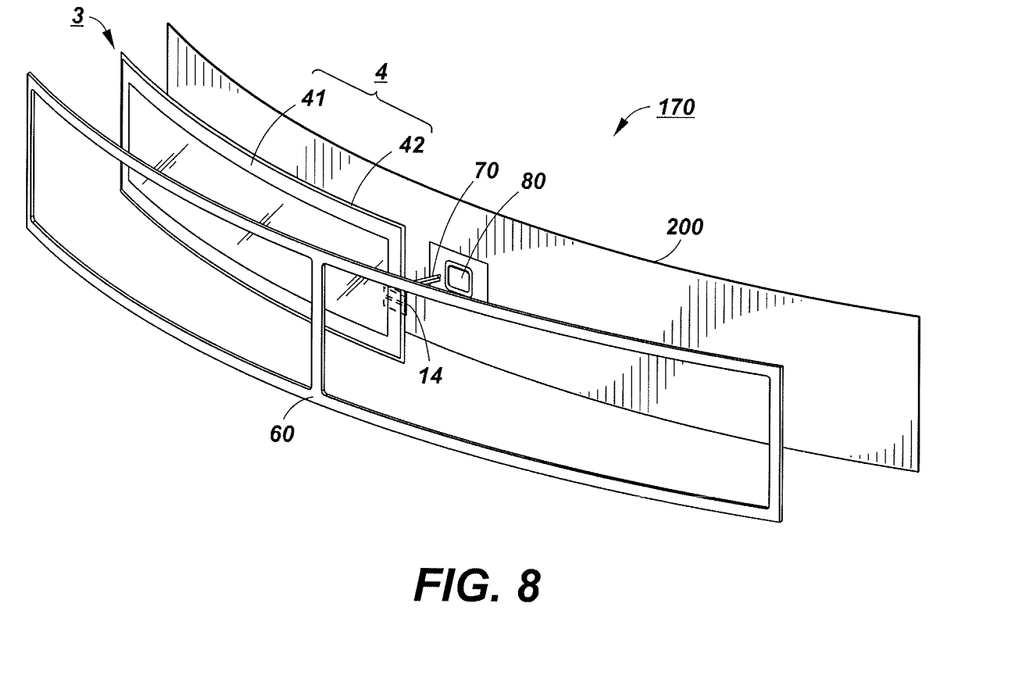
FIG. 8 is an exploded view of the emissive side of an OLED module that uses two adjacent OLED lighting panels.

The module may contain more than two or more adjacent OLED lighting panel that all emit light in the same direction. One example 170 is shown in FIG. 8. There is a curved support 200 on which is located two OLED lighting panels 3 (as shown in FIGS. 3A-3C); however, only one panel is shown for clarity. On the emissive side of the OLED panel 3, there is an opaque liner 4 with two portions 41 and 42.

First portion 41 of the opaque liner is located over the OLED substrate of the OLED lighting panel 3. Second portion 42 extends past the edges of the OLED substrate and therefore past the edges of OLED lighting panel 3. Second portion 42 of the opaque liner 4 is covered by bezel 60 and when assembled, the bezel 60 holds the OLED panel 3 to the support through section 42 of the opaque liner. The edge of the OLED panel contact pad 14 (on the non-emitting side of the panel) can be seen along with external wires 70 which extend through opening 80 in support 200. The two OLED panels would be arranged so that their contact pads would be orientated towards each other but not directly touching. Note that the bezel 60 has a crossing section that covers and hides the adjoining edges of the two OLED panels.

It is desirable that the OLED lighting module have external electrical connections accessible through an opening located in the middle of the backside of the module. Typically, OLED panels will have electrical contact pads located along one edge of the panel. Thus, when there is one or an odd number of OLED panels in the module, at least one of the OLED panels will have electrical connections that extend from the panel contact pad on the edge of the panel to the center of the backside of the panel. For example, see FIG. 4. However, when there are two or an even number of OLED panels in the module, this is not necessary since the contact pads located on the edge of at least one of the OLED panels will be located near the opening in the middle of the backside of the module. For example, see FIG. 8.

The support of the OLED module can be either rigid and flat or rigid and curved. It may be made of metal or plastic or other materials so long as it has sufficient mechanical strength. If metal, it can serve as a heat sink. It is preferred that the support is opaque, although in some designs it may have translucent or transparent sections. Typically, the support will be greater in both length and width than the OLED light panel. The support may be continuous without any openings under the OLED panel, or may have cut-outs or openings as desired. While the support will typically conform to the overall shape of the OLED lighting panel, this is not necessary and the support may have extensions or portions that do not conform to the shape of the OLED panel. The support may be part of the module surface or the support may be contained within another housing which serves as the outside surface of the module. The support may have provisions for attaching the module to a luminaire. Desirably, the support should be no more than 1 mm thick and more desirably in the range of 0.05-0.75 mm thick. While the support would typically have constant thickness throughout, it may have sections that are thinner than others. While the support would typically form a single plane (either flat or curved), it may have sections that are out-of-plane (i.e. raised or indented) relative to others.

For curved supports, the curve can be a simple regular curve or arc with no straight portions. However, it can also form more complex curves such as S-shaped or sine curves. It may have one or more straight portions joined by a curved section such as an inverted V or W shape. The emissive side of the OLED panel can be orientated along the outside or exterior side of the curve (away from the center point) or orientated along the inside or interior side of the curve (towards the center point). The curved support can be made of, for example, molded plastic, stamped metals or metals that retain their shape after bending such as annealed aluminum.

The OLED panel lies upon and conforms to the shape of the support, whether planar or curved. A bezel covers the vertical sides and at least a portion of the front surface along the top edge. If the support is rigid, the bezel may be rigid or flexible. If the support is curved, the bezel should match the curvature of the support. The bezel may be made of the same material as the support or be made from a different material. It is desirable that the bezel match the support in appearance and material, although this is not necessary. While the bezel would typically have constant thickness throughout, it may have sections that are thinner or thicker than others.

In order to minimize the thickness of the module, the bezel should not cover any part of the OLED substrate, but rather only by those portions of the opaque liner or parts of the OLED panel that extend past the outside edges of the OLED substrate. If there is only one extending portion under the bezel, it should be the second section of the opaque liner which is located on the emissive side of the OLED substrate. There can be more than one other extending portions under the bezel. In the case of two or more extending portions being under the bezel, there should be desirably at least one extended or overhanging portion that lies on one side of the OLED substrate and at least one extended portion that lies on the opposite side of the OLED substrate. Desirably, the bezel should be relatively thin in width over the front surface of the module in order to provide a slick appearance. Desirably, the bezel should be less than 10 mm wide (as measured from the interior edge of the bezel over the opaque liner to the outer edge) and more desirably 5 mm or less.

For example, in the embodiment shown in FIG. 4, the opaque liner, located on the emissive side of the panel, extends past the outside edge of the OLED substrate and under the bezel. The bezel does not extend over the OLED substrate; it extends only over that portion of the opaque liner that extends past the edges of the OLED substrate. The backing plate, located on the opposite side of the substrate from the opaque liner, can also extend past the outside edge of the OLED substrate and under the bezel, as shown in FIG. 7. Thus, in this embodiment, the OLED panel is held against the support by the bezel by the two extending portions of the opaque liner and the backing plate, each located on different sides of the OLED substrate. In this way, the module can be made very thin since the bezel does not have to cover the OLED substrate, which is one of the thickest parts of the OLED panel.

In particular, the bezel may cover any of the following combinations of parts that extend past the outside edges of the OLED substrate: the opaque liner alone, the opaque liner+transmissive covering, the opaque liner+transmissive covering+circuit board, the opaque liner+transmissive covering+circuit board+backing plate, the opaque liner+circuit board, the opaque liner+circuit board+backing plate and the opaque liner+backing plate. In some cases, there may be adhesive between the bezel and the extending parts of the OLED panel.

In some embodiments, the bezel is a separate part from the support. The module is assembled by attaching the bezel around the outside edges of the support so that part of the bezel covers at least that part of the opaque liner not over the OLED substrate to affix the OLED panel within the module. The bezel may be attached to the support by adhesives or by mechanical means (i.e. screws, pins, interlocking features such as snaps, etc.).

In some embodiments, the bezel is an integral part of the support and there is a slot between the upper surface of the support and the bottom of a retaining edge of the bezel. The module is then assembled by sliding the extensions of the OLED lighting panel along the length of the slot. After the OLED panel is inserted and in the desired position, the slot is then closed to complete the assembly.

In some embodiments, the OLED panel is only held against the support by the bezel, which does not hold the OLED substrate directly, but rather by the extending portions of the opaque liner (and, in some embodiments, along with other extending portions). In other embodiments, the panel is additionally held against the support by adhesives as well as the bezel. There may be one point of attachment, multiple points of attachment or continuous attachment. Desirably, the OLED lighting panel is only contained and held in place by compression or pinning between the support and the bezel so that the OLED is free to move due to thermal expansion or contraction.

Although the bezel runs along the outside edges of the module, in some designs the bezel may also have crosspieces that run over the emitting surface. These may be purely decorative, hide non-emitting joints or may serve to stiffen the module or provide physical protection to the front surface.

A curved support, bezel or module (with or without the OLED panel) could also be prepared from a thermoplastic material which is initially flat, heated and molded to into the desired curved shape, and which retains the desired shape upon cooling. Alternatively, they could be formed from a shape-memory alloy which is an alloy that "remembers" its original shape and that when deformed returns to its pre-deformed shape when heated.

In some embodiments, two OLED panels may be assembled back-to-back so that there is two-sided emission. In such cases, the support can either be at least partly transparent or have openings to allow emission in both top and bottom directions. In this embodiment, there would be two bezels, one on each side of the bezel, where each bezel would affix one of the back-to-back OLED panels to the support through two opaque liners, one for each panel. There can be a backing plate between the backsides of the two OLED panels Alternatively, an OLED panel with two-sided emission (that is, the opposite side of the panel is also light emissive) can also be employed. The OLED panel with two-sided emission may be transparent or translucent. In such embodiments, there would be at least one bezel and at least one opaque liner for holding the panel within the module.

Since the opaque liner is located on the emitting side of the OLED lighting panel, the opaque liner should have an open area roughly corresponding to the emitting area of the OLED panel for light emission. The opaque liner should cover the non-emitting areas on the emitting surface of the OLED lighting panel which generally surrounds the light-emitting area. Typically, the opaque liner is attached to the surface of the OLED panel by adhesives. Desirably, the visible width (that is, the part not under the bezel) of the opaque liner should be less than 15 mm and more desirably less than 10 mm. The opaque liner should be flexible. The opaque liner should be thin; desirably, the opaque liner should be no more than 0.5 mm thick and more desirably in the range of 0.01-0.2 mm thick, which includes any adhesive layer if present. Although the opaque liner is formed of one continuous piece, there are at least two sections of the opaque liner: a first section that covers (located over) the OLED substrate of the OLED panel and a second section that extends or overhangs past the outside edges of the OLED substrate so that there is no OLED substrate below the second section. Some suitable materials for the opaque liner would be plastic or polymeric films, glass or metal foils, or woven or non-woven fabrics. It may be made of multiple layers.

There can be a backing plate, which can be flexible, between the circuit board of the OLED lighting panel and the support. In some embodiments, the backing plate extends past the edges of the OLED substrate and under the bezel. In some embodiments, the outside edges of the backing plate correspond to or exceed the outside edges of the circuit board. In other embodiments, the outside edges of the backing plate are entirely within the outside edges of the circuit board. The backing plate may be one solid and continuous piece or may have cut-outs to allow space for the extension tab, wiring that, runs along the back of the panel or for the contact pads of the OLED panel. Alternatively, the backing plate may have channels or inserts to allow space for the wiring. The backing plate may be non-conductive. One suitable material would be Kapton. In some embodiments, the backing plate may be metallic and serve as a heat sink. Desirably, the backing plate should be no more than 0.5 mm thick and more desirably in the range of 0.001-0.2 mm thick. The backing plate may be attached to either the circuit board of the OLED panel or the support of the module or both by adhesives. Desirably, the backing plate is opaque although it may be translucent or transparent to allow for two-sided emission.

The OLED lighting panel for use in the module will typically have its electrical contact pads for supplying power to the internal electrodes in the non-emitting areas of the panel. The contact pads are generally either located on the front side along the side of the emitting areas or along the edge of the back side of the panel. Both types are suitable for use in the module.

External electricals wires will supply power to the contact pads of the OLED panel within the module. These wires can be attached to the contact pads by any known method such as soldering, conductive glue, ACF (Anisotropic Conductive Film), etc. Because it is desired that the module be as thin as possible, flat wires should be used within the module. The external wires may pass through an opening anywhere in the module. For example, the opening may be along one edge (for example, between the bezel and support or directly through the side of the bezel), along the front edge (for example, through the top of the bezel, through the opaque liner or both) or anywhere on the back of the module through the support. Most desirably, the opening is located in the geometric center of the backside of the support. In some cases, there may be more than one opening for different sets of external wires for independently supplying power to different OLED panels. The flat wires within the module made be connected to a separate pass-through circuit board at the opening so that round wires can be used outside the module. The opening may be sealed after assembly; for example, by silicon sealant.

The OLED module may have provisions or structures that enable mechanical attachment to a luminaire. Such attachment points may be anywhere on or across the device. There can be one attachment point or multiple attachment points. Ideally, the attachment point may be at a balance point of the module although this is not necessary. The mechanical attachment feature may also provide electrical connection or may be separate from the electrical connection. The mechanical attachment feature may be permanent (for example, a solder joint between the module and a supporting structure), flexible or adjustable (for example, a ball and socket joint) or temporary and removable (for example, a detachable tab and socket mechanism).

Suitable OLED lighting panels are any that can be used for general lighting applications. However, the panel may be modified for use in specific applications. For example, it may be fitted with a lens to concentrate the emitted light in order to act as highlighting or it may be fitted with filters to adjust the color temperature of the emitted light.

The OLED panel desirably has a flexible transmissive cover on its emitting surface. It may have the same area as the emissive area of the OLED, or the same area as the OLED substrate and cover both the emitting and non-emitting areas. It may be larger than the OLED substrate. The transmissive cover may be a flexible optically clear protective film or provide light management functions such as diffusion or light scatter, color filter or a polarization filter. The flexible transmissive cover may be a light management film or unit that serves a number of purposes and may be composed of multiple layers. Its primary purpose is to increase the amount of light scatter of the light being transmitted through the OLED substrate, thus improving light distribution from the device and improving overall efficiency. Generally, the flexible light management unit will have a light scattering medium located either on the surface or within a flexible polymeric or glass substrate or the flexible substrate will contain physical structures (for examples, bumps or projections of various shapes) that cause light scattering. In some cases, the flexible light management unit may be part of the same OLED substrate as the OLED unit. In other cases, it may be a separate unit that is applied to the light-emitting surface of the OLED unit/substrate using an optically clear adhesive. In addition to its light management function, it will also help to protect the surface of the device from damage. In embodiments where the light management unit is larger in area than the OLED substrate so there is a portion that overhangs the OLED substrate, the overhanging portions may extend under the bezel and help to hold the OLED lighting panel within the module.

Desirably, the OLED substrate is flexible and can be made of flexible glass, polymeric materials or metals. Flexible glass is most desired. Generally speaking, it will be flat with a uniform thickness. For bottom emitting OLEDs, the substrate should be transparent. For top emitting OLEDs, the substrate may be opaque or transparent (allowing for two-sided emission) as desired. The top surface of the OLED substrate is that facing the OLED light-generating unit. Since the substrate will be part of the overall encapsulation for the OLED, it should be sufficiently impervious to air and water so that the OLED will have desired lifetime. The OLED substrate may have various types of subbing layers which may be patterned or unpatterned and can be either on the top or bottom surfaces.

On the OLED substrate, there is an OLED light-emitting unit with a first electrode, electroluminescent layer(s), and second electrode, all fully covered by encapsulation to prevent contact with air and water. In the OLED unit, there is a first electrode that covers the top surface of the substrate and desirably completely covers the top surface of the substrate. The first electrode can be an anode or a cathode and can be transparent, opaque or semi-transparent. Desirably, the first electrode is a transparent anode and the OLED device is a bottom emitter. The transparent first electrode should transmit as much light as possible, preferably having a transmittance of at least 70% or more desirably at least 80%. However, in some applications (i.e. microcavity devices), the transparent first electrode may only be semi-transparent and have partial reflectivity. While the first transparent electrode may be made of any conductive materials, metal oxides such as ITO or AZO or thin layers of metals such as Ag are preferable. In some cases, there may be an auxiliary electrode to help distribute charge more uniformly across the full plane of the transparent electrode.

The electroluminescent layer of the OLED light-generating unit is located between the electrodes. The electroluminescent layer may include multiple layers where at least one organic layer will be electroluminescent. Formulations and layers appropriate for OLED type light emission are well known and can be used as desired. The organic layers may be small molecule or polymeric. The organic layers may be deposited by any known method including vapor deposition, solution coating, ink-jet techniques, spraying and the like. The organic layers may be patterned. Inorganic electroluminescent materials such as quantum dots could also be used for light emission. Because such formulations also include organic materials, the use of inorganic electroluminescent materials can be considered as an OLED for the purpose of the invention.

Over the electroluminescent layer, there is a second electrode. It may be an anode or a cathode; preferably a cathode. The second electrode may be transparent or opaque, preferably opaque. If transparent, it is desirably composed of conductive transparent metal oxides such as ITO or thin layers of metals such as Ag. If opaque, it is desirably composed of a thicker layer of metal or metal alloy such as Al, Ag, Mg/Al, Mg/Ag and the like. The second electrode may be deposited by any known technique.

Over the second electrode, there may optionally be a protective organic layer, protective inorganic layer, or a combination of both. This is to prevent damage to the second electrode and underlying organic layers during encapsulation.

The OLED light-emitting unit is fully encapsulated. The encapsulation is provided on one surface by the OLED substrate. The sides and top of the OLED unit can be encapsulated by a flexible impervious cover that is affixed to the substrate to seal the OLED unit. Most desirably, the encapsulation of the sides and top of the OLED unit is provided by thin-film encapsulation. Thin-film encapsulation typically includes multiple (for example, 3 or more) alternating layers of inorganic and organic materials. Alternatively, thin-film encapsulation may also comprise a two-layer barrier system of an adhesive layer with water adsorbing getter particles covered with an impermeable layer or film such as a thin metal foil or a plastic barrier film. There are electrically conductive extensions of the first and second electrodes that will extend through and beyond the encapsulation and form contact pads in the non-encapsulated regions for external electrical connection.

Over the light-generating unit/substrate, there can be optional adhesive materials and/or protective layers to fasten the OLED unit/substrate to an overlying circuit board. These materials should be flexible. Examples of suitable adhesive materials would be double sided adhesive tape or liquid adhesive, which may be applied by spraying, brushing, rolling, lamination or similar methods. There may also be metal foil present to help serve as a heat sink as well to prevent damage to the OLED unit during manufacture. Inorganic or polymeric layers may also be used as protective layers. The metal foil or other protective layers may be present between adhesive layers. If the adhesive or protective layers are electrically conductive, they must be arranged not to come into contact with either the contact pads of the OLED unit or the flat electrical connectors of the circuit board or any connectors between the two.

Over the light-generating unit/substrate and optional adhesive materials and/or protective layers, there is a printed circuit board, which may be flexible. Thus, the circuit board is on the opposite side of the OLED unit from the OLED substrate. The main body of the circuit board desirably has the same or greater area than the emissive area of the OLED unit, even though it may be located on the opposite side of the emissive side of the OLED substrate. In this way, the circuit board can provide protection against damage to the underlying OLED unit as well as acting as a heat sink. Moreover, the circuit board can completely overlap and could have an area the same as or greater than that of the OLED substrate. In embodiments where the circuit board is larger in area than the OLED substrate so that there is a portion that overhangs the OLED substrate, the overhanging portions may be used to attach the panel to a mounting or surface. In other embodiments, the circuit board can have non-printed electrical connections. In yet other embodiments, the circuit board is smaller in area than the emissive area of the OLED and can be located along the side of the OLED substrate or can form a frame around the outside edge of the OLED substrate, which may or may not overhang the OLED substrate.

The flexible printed circuit board is made of non-electrically conductive plastic or polymeric materials. It may be composed of two or more layers and these layers can be made of different materials. At a minimum, it has at least two flat electrical connectors on one surface of the circuit board and the extension tab. There may be other electrical control (such as transistors) or power (such as resistors) related features on either surface of the circuit board or on the extension tab. Desirably, it is opaque but may be translucent or transparent for two-sided emission.

The flat electrical connections on the flexible printed circuit board are made of electrically conductive metals such as Al, Cu, Sn. They should have sufficient flexibility to be able to bend without breaking. The surface of the circuit board with the flat electrical connectors faces the adhesive materials and/or protective layers (if present) and the OLED unit. Since the flat electrical connectors may be bent in some embodiments, the flat electrical connectors may contain stress-relieving features that allow the bending without cracking or breaking.

The electrical contact between the flat electrical connectors of the circuit board to the contact pads on the OLED substrate may be direct when the OLED substrate and circuit board are placed face-to-face. Alternatively, electrically conductive glue or adhesive or appropriately sized and shaped ACF may be used to make electrical contact between them. However, other methods for making electrical contact can be used. The flat electrical connectors on the circuit board of the OLED panel connect to electrical contact pads for the panel, which are typically located in non-emitting areas on either the front or back of the panel. This allows for a modular approach where external wires may be connected to the panel in various ways as needed.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

2 Rigid and curved module support
3 Flexible OLED lighting panel
4 Opaque Liner
5 Transition between first portion 41 and second portion 42 of opaque liner 4
6 Bezel
7 External wires
8 Opening in support
10 Backing plate
12 Internal wire connectors
14 Contact pad for OLED panel
20 Rigid and flat module support
30 OLED lighting panel
31 OLED substrate
32 Emissive area of OLED panel/OLED light-emitting unit
33 Encapsulation
34 Circuit board
35 Transmissive covering
36 Extension tab of circuit board
37 Adhesive layer
38 Non-emissive area of OLED panel
41 First portion of opaque liner 4
42 Second portion of opaque liner 4
60 Bezel
61 Thickening in bezel
62 Adhesive area
63 Adhesive overflow area
70 External wires
80 Opening in support
100 OLED Module
110 OLED Module
120 OLED Module
150 OLED Module
141 Flat electrical connector
142 Flat electrical connector
143 Electrical lead
144 Electrical lead
170 OLED Module
200 Curved module support
300 OLED lighting panel
335 Flexible transmissive covering

The invention claimed is:
1. An OLED lighting module comprising:
a support;
one or more OLED lighting panel(s) on the support, wherein each OLED panel has an emissive side with emissive and non-emissive areas and an opposite side; and comprises an OLED substrate, an encapsulated OLED light-generating unit on the OLED substrate and a circuit board containing flat electrical connectors, the circuit board being located between the OLED light-generating unit and the support;
an opaque liner on the emissive side of the OLED panel which does not significantly cover the emissive area, the opaque liner having two sections: a first section that covers at least part of the non-emissive areas over the OLED substrate and a second section that extend past the edges of the OLED substrate and where the first and second sections of the opaque liner cover areas with different heights; and an opaque bezel in contact with the support, the opaque bezel covering at least part of the second section of the opaque liner but not the first section of the opaque liner, and wherein the OLED panel is retained to the support by the bezel.

2. The OLED lighting module of claim 1 where the support is rigid and curved.

3. The OLED module of claim 2 where the external electrical connections to the flat electrical connectors of the OLED lighting panel are made though an opening at the midpoint of the curvature.

4. The OLED lighting module of claim 1 where the support is flexible.

5. The OLED lighting module of claim 1 wherein the OLED lighting panel is flexible.

6. The OLED lighting module of claim 1 wherein the OLED lighting panel has a flexible transmissive cover over the emissive areas of the OLED panel.

7. The OLED lighting module of claim 6 wherein the flexible transmissive covering is a light-management film that extends past the edges of the OLED substrate and is covered by the opaque liner in the non-emissive areas along with the bezel.

8. The OLED lighting module of claim 1 wherein a portion of the circuit board of the OLED lighting panel extends past the edges of the OLED substrate and where at least part of the extending portion is covered by the bezel.

9. The OLED lighting module of claim 1 comprising a backing plate located between the circuit board and the support.

10. The OLED lighting module of claim 9 wherein a portion of the backing plate extends past the edges of the OLED substrate and where at least part of the extending portion is covered by the bezel.

11. The OLED lighting module of claim 1 where there is a second OLED lighting panel assembled back-to-back to the OLED lighting panel so there is two-sided emission and the support is either at least partly transparent or have openings to allow emission in two directions.

12. The OLED lighting module of claim 1 where the module contains two or more adjacent OLED lighting panel that emit light in the same direction.

13. The OLED module of claim 1 where the external electrical connections to the flat electrical connectors of the OLED lighting panel are made though an opening in the center of the backside of the module.

14. The OLED module of claim 1 where the opaque liner is no more than 0.5 mm thick.

15. The OLED module of claim 1 where the bezel is less than 10 mm wide.

* * * * *